United States Patent [19]
Konecni et al.

[11] Patent Number: 6,069,072
[45] Date of Patent: May 30, 2000

[54] CVD TIN BARRIER LAYER FOR REDUCED ELECTROMIGRATION OF ALUMINUM PLUGS

[75] Inventors: Anthony J. Konecni; Girish Anant Dixit, both of Plano, Tex.

[73] Assignee: Texas Instruments Incorporated, Dallas, Tex.

[21] Appl. No.: 09/060,920

[22] Filed: Apr. 15, 1998

Related U.S. Application Data

[60] Provisional application No. 60/044,375, Apr. 28, 1997.

[51] Int. Cl.[7] .................................................. H01L 21/4763
[52] U.S. Cl. ........................ 438/642; 438/584; 438/597; 438/618
[58] Field of Search ................................. 438/642, 584, 438/597, 618

[56] References Cited

U.S. PATENT DOCUMENTS

| | | |
|---|---|---|
| 5,288,665 | 2/1994 | Nulman . |
| 5,688,718 | 11/1997 | Shue . |
| 5,744,386 | 4/1998 | Kenney . |

OTHER PUBLICATIONS

1995 IEEE, "Fully Planarized Four–Level Interconnection With Stacked Vias Using CMP of Selective CVD–A1 and Insulator and its Application to Quarter Micron Gate Array LSIs," pp. 18.8.1–18.8.2 (T. Amazawa, E. Yamamoto, K. Sakuma, Y. Ito, K. Kamoshida, K. Ikeda, K. Saito, H. Ishii, S. Kato, S. Yagi, K. Hiraoka, T. Ueki, T. Takeda and Y. Arita).
1995 American Vacuum Society, "Chemical Vapor Deposition TiN Process for Contact/Via Barrier Applications", pp. 2105–2114 (Ajit Paranjpe and Mazhar IslamRaja).
Jpn. J. Appl. Phys. vol. 33, Part 1, No. 1B, Jan. 1994, "Characterization of Direct–Contact Via Plug Formed by Using Selective Aluminum Chemical Vapor Deposition", pp. 424–428, (Nobuyuki Takeyasu, Yumiko Kawano, Eiichi Kondoh, Tomoharu Katagiri, Hiroshi Yamamoto, Tomohiro Ohta).
Conference Proceedings ULSI–X 1995 Materials Research Society, "Via Plugging by Selective–CVD–A1: Pretreatment of Via Holes With or Without Cap–Metal", pp. 487–495, (N. Takeyasu, E. Kondoh, Y. Kawano and T. Ohta).

*Primary Examiner*—Kevin M. Picardat
*Assistant Examiner*—Deven M. Collins
*Attorney, Agent, or Firm*—Jacqueline J. Garner; W. James Brady, III; Richard L. Donaldson

[57] ABSTRACT

A structure and method incorporating a CVD TiN barrier layer 230 over the aluminum plug 220 in order to prevent the high plug resistance caused by the blanket metal film stack 240, 250, and 260 deposition process. Unlike physical vapor deposited (PVD) TiN, CVD TiN 230 does not react with the aluminum 220 during annealing. CVD TiN has also been shown to be a better diffusion barrier for aluminum than PVD TiN. In addition, CVD TiN will disrupt any unfavorable grain boundary propagation through the aluminum plug which may act as a source of electromigration failure. Therefore, the CVD TiN 230 can increase the electromigration resistance, without increasing the contact/via resistance.

11 Claims, 2 Drawing Sheets

CVD TIN BARRIER LAYER FOR REDUCED ELECTROMIGRATION OF ALUMINUM PLUGS

This application claims priority under 35 USC §199 (e)(1) of provisional application No. 60/044,375, filed Apr. 28, 1997.

BACKGROUND AND SUMMARY OF THE INVENTION

The present invention relates to integrated circuit metallization structures and fabrication methods.

BACKGROUND: ALUMINUM PLUGS

In modern integrated circuit fabrication, it is increasingly necessary to fill vias and contact holes which have a high "aspect ratio". This means a ratio of height to width which is 2:1 or more, and, as technology progresses, may be as high as 10:1 or more in future generations. Completely filling such holes with metal at an acceptably low temperature is very difficult, particularly for metals such as aluminum.

In the past, tungsten plugs have been used for via and contact fill in semiconductor manufacturing. However, as contact and via diameters grow smaller and aspect ratios become larger, it becomes more difficult to fill these vias and contacts with blanket tungsten. In addition, tungsten chemical vapor deposition (CVD) requires barrier and glue layers, which raises the processing costs and increases the device complexity.

Recently, contact and via filling with aluminum alloys has attracted a great deal of attention. Compared with contact/via filling with chemical vapor deposition (CVD) tungsten, aluminum filling has the advantages of lower cost, higher yield, and potentially better electromigration resistance (since there is less flux divergence near the plug).

However, one of the main concerns with aluminum metallization is still electromigration. Stress-induced metal ruptures, which are caused by void formation which occurs at specific grain boundaries where the <111> planes of adjoining grains come into contact, affects electromigration failure because of the flux divergence around the voids. The addition of copper greatly improves the electromigration (EM) lifetime of aluminum interconnects. Thus, typical aluminum alloys use silicon (typically one-half percent to 1 percent atomic) or copper (typically one-half percent atomic) or both as alloying agents. Efforts have been made to find other satisfactory aluminum alloy compositions; see e.g. Kikuta and Kikkawa, "Electromigration characteristics for Al—Ge—Cu," 143 J. Electrochem. Soc. 1088 (1996), which is hereby incorporated by reference.

BACKGROUND: PROBLEMS WITH ALUMINUM PLUGS

Once the aluminum plugs have been formed, the blanket metal stack for the metal lines is then deposited. While the bulk of the stack is usually aluminum, typically a titanium or titanium nitride (TiN) layer is deposited first in order to improve electromigration and to act as a nucleation or wetting layer. In the past, this has not been a problem with tungsten plugs because neither titanium nor TiN reacts with the final tungsten plug. However, with aluminum plugs, experiments have shown that titanium nitride, which is typically formed over the aluminum plugs via reactive sputtering, causes an increase in the via/contact resistance (possibly as a result of the nitrogen ions in the plasma reacting with the aluminum to form aluminum nitride). This can undesirably lead to a higher via/contact resistance.

Experiments have shown that the deposition of titanium prior to the deposition of TiN prevents the formation of the high resistance interface, and thus lowers the via/contact resistance. However, the deposition of a titanium layer in contact with the aluminum plug together with further thermal cycling results in the formation of titanium and aluminum intermetallics, which can further increase the via/contact resistance and reduce the electromigration resistance.

Attempts to deposit TiN using a plasma enhanced CVD process from a titanium chloride source are not feasible due to the excessively high temperatures (e.g. greater than 400 degrees C.), the risk of corrosion due to the presence of chlorine chemistry, and the substantial amount of ion bombardment involved in plasma enhanced CVD processes.

CVD TiN Barrier Structures and Methods

The present application discloses the use of a CVD TiN barrier layer over the aluminum plug in order to prevent the high plug resistance caused by the blanket metal film stack deposition process. When compared to physical vapor deposited (PVD) TiN, during annealing in an aluminum stack, CVD TiN is more inert. Therefore, the CVD TiN barrier layer can increase the electromigration resistance without increasing the contact/via resistance, because thin CVD TiN films advantageously disrupt any grain boundary propagation through the aluminum plug which may act as a source of electromigration failure.

Advantages of the disclosed methods and structures include: lower via/contact resistance; improved electromigration resistance; lower cost; and the process can be done in-situ with the metal stack deposition.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Top Barrier Layer Embodiment: CVD TiN

Figure 1:
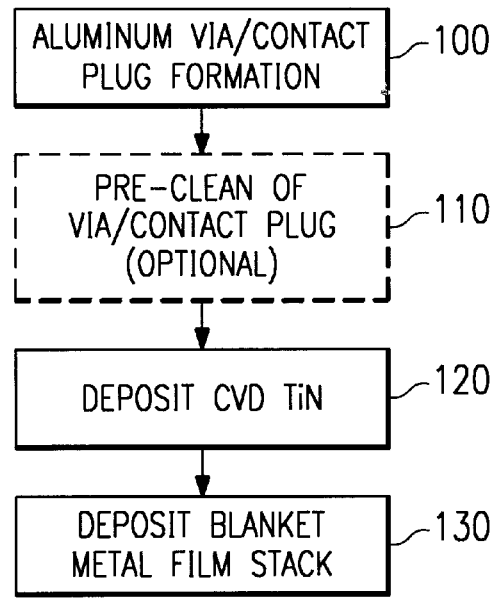
FIG. 1 shows a process flow for fabricating metal lines with aluminum via/contact plugs in accordance with preferred embodiments of the present invention.
Figure 2A:
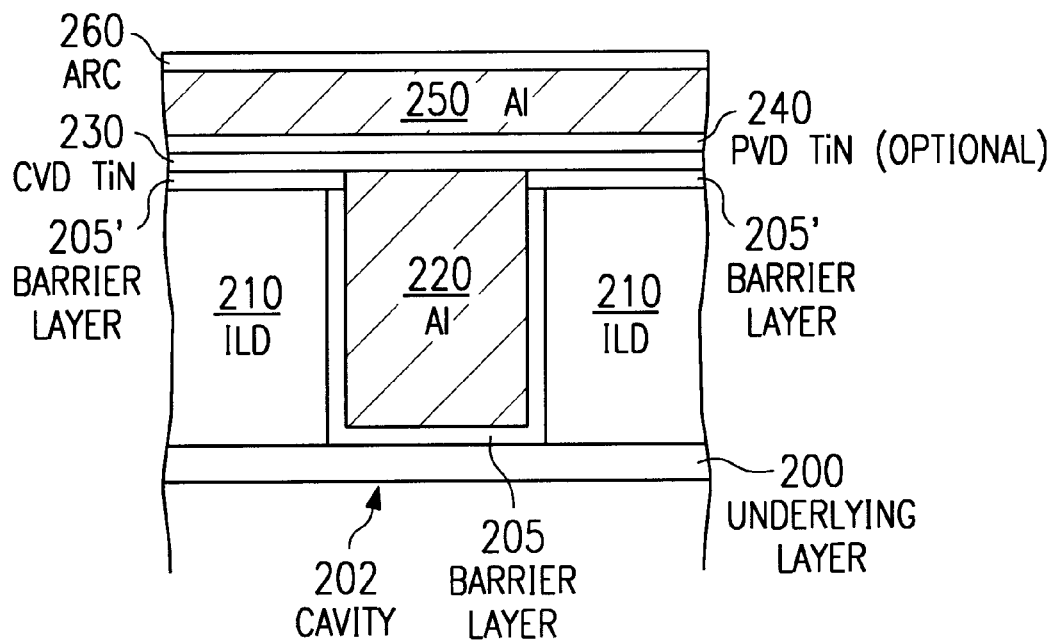
FIGS. 2A and 2B are cross-sectional views of a metal stack overlying an aluminum via/contact plug in accordance with preferred embodiments of the present invention.

FIG. 1 shows a process flow for fabricating metal lines with aluminum via/contact plugs, while FIG. 2A schematically illustrates an aluminum via/contact plug formed using preferred-embodiments of the present invention.

As shown in FIG. 2A, a contact or via hole 202 has been etched through a dielectric layer 210 to expose an underlying layer 200, followed by the filling of the cavities 202 with a layer of aluminum or aluminum alloy 220 by selectively depositing the aluminum 220. Thereafter, the aluminum 220 is chemical mechanical polished (CMP) on top of the dielectric 210 to form aluminum plugs 220 (step 100). Optionally, a liner layer 205 (e.g. TiN) can be deposited prior to the aluminum 220 deposition. (If the aluminum plugs 220 are formed by CMP, the portion of the liner layer 205' on top of the dielectric will be removed.) Following the process of aluminum via/contact plug formation (step 100), a pre-clean step (optional step 110) of the via or contact plug 220 can then optionally be performed to eliminate native oxides and residue on the aluminum plugs 220.

Subsequently, a layer of CVD TiN 230 is deposited (step 120) over the aluminum via/contact plugs 220, in order to prevent the electromigration failure of the aluminum plugs 220. Advantageously, the CVD TiN layer 230 does not react with the aluminum 220 during annealing processes. Therefore, the resistance of the vias or contacts does not increase. In addition, experimental results have demonstrated that CVD TiN adheres well to oxide, and therefore the possibility of the CVD TiN film 230 lifting off of the dielectric 210 is minimized. The superior barrier properties of CVD TiN as compared with PVD TiN and the reduced reaction of CVD TiN with aluminum is discussed in, for example, the following article: Paranjpe et al., "Chemical Vapor Deposition TiN Process for Contact/Via Barrier Applications," J. VAC. SCI. TECHNOL. B, vol.13, no.5 (1995), which is hereby incorporated by reference.

Finally, the metal film stack, typically an optional PVD TiN layer 240 followed by a layer of aluminum alloy 250 and a top anti-reflective coating (ARC) layer 260 (e.g. TiN), is blanket deposited (step 130) over the CVD TiN barrier layer 230.

Advantageously, with selective CVD aluminum 330, there is no void formation, as with blanket CVD. Furthermore, it is possible to plug different via 320 depths without unevenness. These and other advantages of selective CVD aluminum are discussed in, for example, the following articles: Amazawa et al., "Fully Planarized Four-Level Interconnection with Stacked Vias Using CMP of Selective CVD-Al and Insulator and Its Application to Quarter Micron Gate Array LSIs," IEDM, p.473–76 (1995); Takeyasu et al., "Characterization of Direct-Contact Via Plug Formed by Using Selective Aluminum Chemical Vapor Deposition," JPN. J. APPL. PHYS., vol.33, p.424–28 (January 1994); and Takeyasu et al., "Via Plugging by Selective-CVD-Al: Pretreatment of Via Holes with or without Cap-Metal," CONFERENCE PROCEEDINGS ULSI, p.487–94 (1995), all of which are hereby incorporated by reference.

Figure 3:
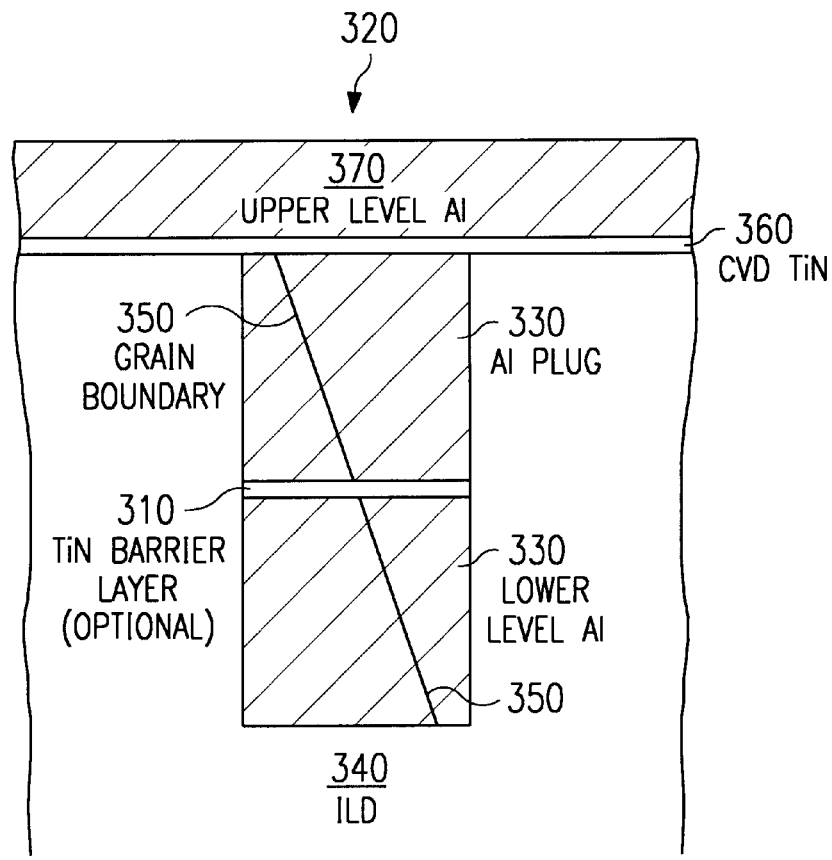
FIG. 3 shows the formation of an aluminum plug using a selective CVD process in accordance with embodiments of the present invention.

However, with aluminum plugs 330, the grain boundary 350, which acts as a source of rapid diffusion and serves as a possible source of voiding, occasionally extends from the bottom of the via 320 to the upper level aluminum film 370, through the aluminum via plug 330, which can lead to electromigration failure. This is observed when a part of the grain boundary 350 of the lower level aluminum-alloy 300 is located at the bottom of the hole 320. By using a CVD TiN barrier layer 360 (instead of a PVD titanium/TiN stack) over the aluminum via plug 330, the grain boundary 350 is prevented from entering the upper level aluminum 370, which is shown in FIG. 3.

The following data gives actual results using sample embodiments of the present invention. The plugs were formed by selective CVD of aluminum, followed by the blanket deposition of CVD TiN and PVD Al—Cu over the aluminum plugs.

| CVD Aluminum | Range |
|---|---|
| Carrier (H2 or Ar) Flow (sccm): (through DMAH bubbler) | 50–300 |
| Diluent (H2 or Ar) Flow (sccm): | 0–500 |
| Time (sec): | 5–60 |
| Pressure (Torr): | 0.1–40 |
| Heater Temp (degrees C.): | 160–260 |

| | Exact | Range |
|---|---|---|
| CVD TiN | | |
| Carrier (He) Flow (sccm): (through TDMAT bubbler) | 70 | 30–100 |
| N2 Flow (sccm): | 10 | 0–500 |
| H2 Flow (sccm): | 0 | 0–500 |
| Ar Flow (sccm): | 200 | 200 |
| Power (watts): | 0 | 0 |
| Time (sec): | 8 | 5–20 |
| Pressure (mTorr): | 1.2 | 0.5–2.0 |
| Heater Temp (degrees C.): | 420 | 400–460 |
| PVD AlCu | | |
| Ar Flow (sccm): | 25 | 10–30 |
| Ar Flow (sccm) Heater: | 15 | 10–20 |
| Power (watts): | 8000 | 2000–16000 |
| Time (sec): | 27 | 10–120 |
| Pressure (mTorr): | 3 | 2–4 |
| Heater Temp (degrees C.): | 300 | 200–450 |

Second Top Barrier Layer Embodiment: CVD TiNC

Alternatively, titanium nitride carbide can be chemically vapor deposited from an aminotitanium source (e.g. TDMAT, TDEAT, or TMEAT) over the aluminum plug prior to the metal stack deposition to improve the electromigration resistance. The titanium nitride carbide has from 5 to 30 percent atomic of carbon.

Third Top Barrier Layer Embodiment: CVD TiAlN

Alternatively, a layer of TiAlN can be chemically vapor deposited over the aluminum plug prior to the metal stack deposition to improve the electromigration resistance.

Fourth Top Barrier Layer Embodiment: CVD TiSiN

Alternatively, a layer of TiSiN can be chemically vapor deposited over the aluminum plug prior to the metal stack deposition to improve the electromigration resistance.

First Plug Deposition Process Embodiment: Extrusion Filling

The aluminum plug can be formed by a cavity filling with high pressure extrusion process, in which a layer of aluminum alloy is deposited at temperatures no greater than 400 degrees C. to close the mouth of the cavity. Thereafter, the aluminum alloy is forced into the cavity by high pressure argon or other gas (60–90 MPa).

Second Plug Deposition Process Embodiment: Aluminum Reflow

In an alternative embodiment, aluminum alloy is reflowed into the cavity by one step sputtering at elevated temperatures (e.g. greater than or equal to 350 degrees C. but preferably less than 450 degrees C.) and low power (to allow time for the aluminum to diffuse into the contacts and vias). Alternatively, a multi-step sputtering operation can be used, first at low temperature (e.g. less than 100 degrees C.), then at high temperature (e.g. greater than 400 degrees C.).

Third Plug Deposition Process Embodiment: Other Selective CVD Aluminum Source

In a further alternative embodiment, as shown in FIG. 3, aluminum 330 can be selectively deposited in the via holes 320 using tri-isobutyl aluminum (TIBA) as the aluminum source. Optionally, a barrier layer 310 (e.g. TiN) can be deposited over the lower level metal 300 prior to the interlevel dielectric 340 (ILD) deposition and the formation of vias 320 within the ILD 340.

Fourth Plug Deposition Process Embodiment: CVD Aluminum

In a further alternative embodiment, the aluminum plug can be formed using a blanket CVD aluminum process to completely fill the cavity with CVD aluminum. Excess aluminum can then be removed by chemical mechanical polishing (CMP) in order to create an aluminum plug.

Fifth Plug Deposition Process Embodiment: CVD Aluminum/PVD Aluminum

In a further alternative embodiment, the aluminum plug can be formed by depositing a thin (e.g. less than 100 nm) blanket layer of aluminum using a CVD process followed by PVD aluminum deposition and reflow of the aluminum to completely fill the cavity. Excess aluminum can then be removed by CMP in order to create an aluminum plug.

Sixth Plug Deposition Process Embodiment: PVD Aluminum

Alternatively, aluminum plugs can be fabricated by physical vapor depositing (PVD) aluminum alloy on the surface of the dielectric and within openings in the dielectric, followed by the CMP of the aluminum alloy on top of the dielectric to form the aluminum plugs.

Seventh Plug Deposition Process Embodiment: Non-Selective CVD Aluminum

Alternatively, aluminum plugs can be formed by non-selectively chemical vapor depositing a layer of aluminum on the surface of the dielectric and within openings in the dielectric, followed by the CMP of the aluminum on top of the dielectric to form the aluminum plugs. However, with non-selective CVD aluminum, a nucleation layer has to be deposited prior to the aluminum deposition.

Alternate Metal Film Stack Embodiment: PVD TiN/Al

Alternatively, a layer of PVD TiN can be deposited over the CVD TiN barrier layer prior to the deposition (e.g. by sputtering) of the upper aluminum layer, without any top ARC layer.

Alternate Metal Film Stack Embodiment: Al/SiOyNx

Alternatively, a layer of silicon oxynitride can be deposited over the upper aluminum layer to serve as the anti-reflective coating. However, during subsequent processing steps, such as the deposition, patterning, and etching of an interlevel dielectric layer, the silicon oxynitride layer must be removed in order to contact to the underlying aluminum layer.

Alternate Metal Film Stack Embodiment: Al/TiN

Figure 2B:
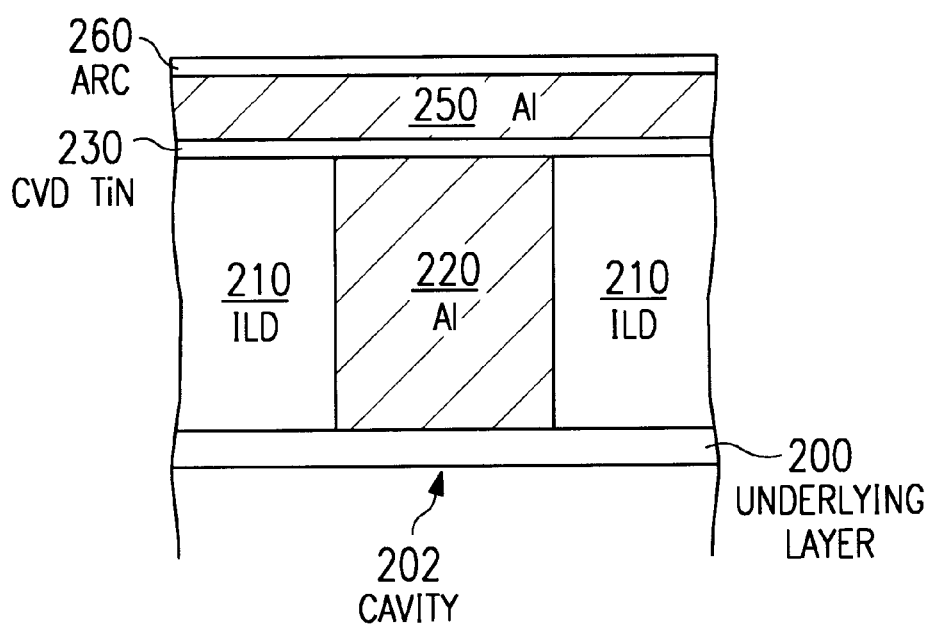

Alternatively, as shown in FIG. 2B, an upper layer of aluminum 250 can be deposited directly over the CVD TiN layer 230 without any intervening barrier layers (e.g. barrier layers 205 and 240 of FIG. 2A have been removed). An anti-reflective coating layer 260 (e.g. TiN) overlies the upper layer of aluminum 250.

First CVD TiN Deposition Embodiment: In-Situ

In a preferred embodiment, the CVD TiN is deposited in-situ (e.g. without a vacuum break) with the aluminum via/contact plug formation, which advantageously reduces the manufacturing cost and lowers the via resistance by preventing oxygen incorporation into the CVD TiN.

Second CVD TiN Deposition Embodiment: Ex-Situ

In an alternative embodiment, the CVD TiN can be deposited ex-situ (e.g. with a vacuum break) with the aluminum via/contact plug formation.

Alternate TiN Barrier Layer Deposition Embodiment: ECVD

Alternatively, the TiN barrier layer overlying the aluminum plug can be deposited using an enhanced CVD (ECVD) process. ECVD TiN films are CVD TiN films which have been plasma treated in hydrogen and nitrogen to density the film and decrease the carbon content. ECVD uses ion bombardment as a post deposition phase treatment, but not during the deposition phase.

The following data gives actual results of ECVD TiN using sample embodiments of the present invention.

| ECVD TiN | | |
|---|---|---|
| Deposition | Exact | Range |
| Carrier (He) Flow (sccm): (through TDMAT bubbler) | 70 | 30–100 |
| N2 Flow (sccm): | 10 | 0–500 |
| H2 Flow (sccm): | 0 | 0–500 |
| Ar Flow (sccm): | 200 | 200 |
| Power (watts): | 0 | 0 |
| Time (sec): | 8 | 5–20 |
| Pressure (mTorr): | 1.2 | 0.5–2.0 |
| Heater Temp (degrees C.): | 420 | 400–460 |

| Plasma Treatment | Exact | Range |
|---|---|---|
| Carrier (He) Flow (sccm): (through TDMAT bubbler) | 0 | 0 |
| N2 Flow (sccm): | 300 | 50–500 |
| H2 Flow (sccm): | 450 | 0–500 |
| Ar Flow (sccm): | 0 | 0 |
| Power (watts): | 350 | 150–450 |
| Time (sec): | 20 | 0–60 |
| Pressure (mTorr): | 1.0 | 0.5–2.0 |
| Heater Temp (degrees C.): | 420 | 400–460 |

First CVD TiN Source Gas Embodiment: TDMAT

CVD TiN can be deposited by the thermal decomposition of tetrakisdimethylaminotitanium (TDMAT). TiN films deposited directly from TDMAT have been reported to have very high carbon content. However, this has been found not to be a problem for many metallization applications. Aluminum plug structures formed using the TiNC containing films have good electromigration resistance.

Second CVD TiN Source Gas Embodiment: TDEAT

CVD TiN can also be deposited by the thermal decomposition of tetrakisdiethylaminotitanium (TDEAT). TiN films deposited directly from TDEAT have been reported to have similar instability problems as in depositions from TDMAT. However, aluminum plug structures formed using the TiNC containing films are predicted to have good electromigration resistance.

Third CVD TiN Source Gas Embodiment: TMEAT

CVD TiN can also be deposited by the thermal decomposition of tetrakismethylethylaminotitanium (TMEAT). TiN films deposited directly from TMEAT have been reported to have similar instability problems as in depositions from TDMAT. However, aluminum plug structures formed using the TiNC containing films are predicted to have good electromigration resistance.

First Metal Film Stack Deposition Embodiment: In-Situ

Preferably, the metal film stack is deposited in-situ with the CVD TiN and the aluminum via/contact plug formation to reduce processing costs.

Second Metal Film Stack Deposition Embodiment: Ex-Situ

Alternatively, the metal film stack can be deposited ex-situ with the CVD TiN deposition.

Alternate Metal Plug Embodiment: Copper

Alternatively, the metal plug can be filled with copper, followed by the deposition of a CVD metal nitride over the copper plugs to increase the electromigration resistance. However, a liner layer typically needs to be deposited within the contact/via prior the copper plug fill.

According to a disclosed class of innovative embodiments, there is provided: A method of fabricating an integrated circuit structure, comprising the steps of: (a.) depositing a first metal layer consisting primarily of aluminum within openings of a dielectric layer; (b.) depositing a layer predominantly comprising titanium nitride, without any titanium metal thereunder, over said dielectric layer and said first metal layer, using a chemical vapor deposition process at a temperature less than 400 degrees C. with no ion bombardment; and (c.) depositing at least a second metal layer predominantly comprising aluminum over said layer of titanium nitride; whereby the electromigration resistance of said structure is increased without increasing the resistance of said first metal layer.

According to another disclosed class of innovative embodiments, there is provided: A method of fabricating an integrated circuit metallization structure, comprising the steps of: (a.) depositing a first metal layer consisting primarily of aluminum, using a selective chemical vapor deposition process, within openings of a dielectric layer; (b.) depositing a conductive nitride barrier layer over said dielectric layer and said first metal layer, without any titanium therebetween, using a chemical vapor deposition process at a temperature less than 400 degrees C. with no ion bombardment; and (c.) depositing at least a second metal layer predominantly comprising aluminum over said conductive nitride layer; whereby the grain boundary of said first metal layer is prevented from going into said second metal layer by said conductive nitride layer.

According to another disclosed class of innovative embodiments, there is provided: An integrated circuit structure, comprising: a layer of titanium nitride carbide, having 5 to 30 percent atomic of carbon, overlying a dielectric layer, without any titanium therebetween, said dielectric layer having openings therein, said openings being filled with a first metal layer consisting primarily of aluminum; and a second metal layer predominantly comprising aluminum being deposited over said layer of titanium nitride carbide; whereby the electromigration resistance of said structure is increased without increasing the resistance of said first metal layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the number of layers of metallization described above does not implicitly limit any of the claims, which can be applied to processes and structures with more or fewer layers.

Of course, the specific etch chemistries, layer compositions, and layer thicknesses given are merely illustrative, and do not by any means delimit the scope of the claimed inventions.

It should also be noted that other CVD barrier layers (e.g. WSiN, TaSiN, TiWN, WN, CrN, and CrAlN) can be used as the top barrier layer for metal plugs. Tungsten nitride is especially useful in copper plugs.

What is claimed is:

1. A method of fabricating an integrated circuit structure, comprising the steps of:
    (a) providing a dielectric having at least one opening;
    (b) depositing a first metal layer consisting primarily of aluminum within said at least one opening of said dielectric layer;
    (c) chemical vapor depositing a layer comprising predominantly titanium nitride directly onto said said first metal layer at a temperature less than 400 degrees C. without ion bombardment; and
    (d) depositing at least a second metal layer comprising predominantly aluminum over said layer of titanium nitride;
    whereby the electromigration resistance of said structure is increased without increasing the resistance of said first metal layer.

2. The method of claim 1, wherein said first metal layer has at least 0.5 percent atomic of silicon.

3. The method of claim 1, wherein said first metal layer has at least 0.5 percent atomic of copper.

4. The method of claim 1, wherein said first metal layer is deposited using a sputter-reflow process.

5. The method of claim 1, wherein said first metal layer is deposited using a high pressure extrusion process.

6. The method of claim 1, wherein said layer of titanium nitride is titanium nitride carbide deposited from an aminotitanium source.

7. The method of claim 1, further comprising the step of, after said step of depositing said layer of titanium nitride, depositing a conductive barrier layer over said layer of titanium nitride.

8. The method of claim 1, further comprising the step of, after said step of depositing said second metal layer, depositing an additional conductive nitride layer over said second metal layer.

9. A method of fabricating an integrated circuit structure, comprising the steps of:
    (a) providing a dielectric having at least one opening;
    (b) depositing a first aluminum based metal layer within said at least one opening of said dielectric layer;
    (c) forming a region of chemical vapor deposited titanium nitride and optional non-chemically vapor deposited titanium nitride over and in contact with said first metal layer at a temperature less than 400 degrees C.; and
    (d) depositing a second aluminum based layer over and in contact with said region of titanium nitride;
    whereby the electromigration resistance of said structure is increased without increasing the resistance of said first layer.

10. The method of claim 6 wherein said first metal layer has at least 0.5 percent atomic silicon.

11. The method of claim 6 wherein said first metal layer has at least 0.5 percent atomic copper.

* * * * *